United States Patent [19]

De Poortere et al.

[11] 4,134,814

[45] Jan. 16, 1979

[54] HALOGENATED PHOTOPOLYMERIZABLE ADHESIVES

[75] Inventors: Michel De Poortere, Brussels; Marc Colpaert, Ghent; Paul Dufour, Ruisbroek; August Vrancken, Dworp, all of Belgium

[73] Assignee: UCB, Societe Anonyme, Belgium

[21] Appl. No.: 682,629

[22] Filed: May 3, 1976

[30] Foreign Application Priority Data

May 12, 1975 [GB] United Kingdom ............... 19787/75

[51] Int. Cl.$^2$ ............................. C08F 2/50; C08F 4/00
[52] U.S. Cl. .............................. 204/159.15; 156/332; 204/159.18; 204/159.19; 260/859 R; 260/860; 260/869; 260/872; 260/884; 260/885; 428/482
[58] Field of Search ............... 204/159.15, 159.18; 260/869; 106/20, 21, 22

[56] References Cited

U.S. PATENT DOCUMENTS

| | | | |
|---|---|---|---|
| 3,389,192 | 6/1968 | Ziegler | 260/862 |
| 3,507,933 | 4/1970 | Larsen et al. | 260/869 |
| 3,536,782 | 10/1970 | Toggweiler et al. | 260/869 |
| 3,577,480 | 5/1971 | Thorpe | 260/869 |
| 3,677,920 | 7/1972 | Kai et al. | 204/159.15 |
| 3,699,022 | 10/1972 | Behrens et al. | 204/159.15 |
| 3,754,054 | 8/1973 | Kimura et al. | 260/860 |
| 3,759,807 | 9/1973 | Osborn et al. | 204/159.23 |
| 3,794,494 | 2/1974 | Kai et al. | 204/159.15 X |
| 3,839,171 | 10/1974 | Akamatsu et al. | 204/159.15 |
| 3,847,771 | 11/1974 | McGinniss | 204/159.24 |
| 3,992,276 | 11/1976 | Powanda et al. | 204/159.16 |

*Primary Examiner*—Walter C. Danison
*Attorney, Agent, or Firm*—Wenderoth, Lind & Ponack

[57] ABSTRACT

Halogenated photopolymerizable adhesive, which comprises: (a) 20 to 70% by weight of at least one halogenated polymer, which: (1) has a chain interrupted by at least one oxygen or nitrogen atom, (2) contains from 4 to 70% by weight of halogen atoms attached to carbon atoms having the electronic configuration sp$^2$, (called "active halogen atoms"), (3) has an average molecular weight between 700 and 10,000 and (4) has a glass transition temperature (Tg) between $-80°$ C and 20° C; (b) 5 to 30% by weight of at least one organic monomer compound containing at least two acrylic and/or methacrylic acid radicals and containing from 0 to 65% by weight of active halogen atoms; (c) 20 to 70% by weight of at least one organic monomer compound containing an acrylic or methacrylic acid radical and containing from 0 to about 65% by weight of active halogen atoms; (d) about 1 to about 25% by weight of a photo-initiator system comprising: (1) 0.5 to 100% by weight of at least one aromatic ketone, (2) 0 to 99.5% by weight of at least one tertiary amine, at least one carbon atom of which, in the alpha position with regard to the nitrogen atom, carries at least one hydrogen atom, (3) 0 to 90% by weight of an aromatic or nonaromatic alpha-dione, the sum of (1) + (2) + (3) representing 100% by weight of the photo-initiator system, the total content of active halogen atoms amonting to 3 to 50% by weight of the total halogenated photopolymerizable adhesive and lamination or contact adhesives based on said halogenated photopolymerizable adhesive.

21 Claims, No Drawings

HALOGENATED PHOTOPOLYMERIZABLE ADHESIVES

The present invention is related to halogenated photopolymerizable adhesives containing acrylic and/or methacrylic acid radicals. More particularly, these photopolymerizable adhesives can be used as lamination adhesives and as contact or pressure-sensitive adhesives which have the property of drying very rapidly at room temperature under the effect of visible or ultra-violet radiation, without causing any pollution of the environment.

According to the present invention, a "laminated product" is to be understood to be a material obtained by sticking at least one film which is transparent to visible or ultra-violet light, preferably of plastics material on at least one film of any other material which may be transparent or opaque and which may be of plastics, metal, paper, fabric or the like. The expression "lamination adhesive" is to be understood to mean the adhesive composition used for the manufacture of this "laminated product". By "contact or pressure-sensitive adhesive" is to be understood a permanently tacky film deposited on any substrate and which is capable of adhering strongly to another substrate under a slight pressure. For a more detailed definition, reference is made to R. Houwink and G. Salomon "Adhesion and adhesives", pub. Elsevier, Amsterdam, 1967, Vol. 2, chapter 17.

Solvent-free lamination adhesives are already known which contain two or more reagent constituents which are reacted together in situ with the formation of a cross-linked adhesive polymer. Examples of this kind of adhesive include a hydroxyl group containing polyester or polyether which is reacted with a diisocyanate or polyisocyanate, an epoxy resin which is reacted with compounds containing at least two active hydrogen atoms and the like. However, these lamination adhesive compositions suffer from the drawback of requiring a complicated installation ensuring that the two or more reagent constituents are mixed in the desired proportions just at the moment of use in order to avoid a premature gelling. Furthermore, the hardening of this type of adhesive, by chemical reaction between its different constituents, is comparatively slow (a few minutes to a few hours) and rarely complete within this period. It is for this reason that the reactive groups which have not yet reacted with one another may react as time goes on, resulting in excessive cross-linkage which renders the adhesive layer brittle, with a decrease in the adhesion, which constitutes an undesirable phenomenon. Finally, a correct dosage of the various constituents of the adhesive is necessary in order to obtain optimum mechanical performance, which imposes a very strict degree of mixing accuracy, which is not always easy to achieve.

For this reason, attention has been turned to another category of lamination adhesives, known as "single-component" adhesives, which are capable of drying very rapidly under the effect of ultra-violet radiation and which are mixtures of polyacrylates of polyols and a chlorinated aromatic photo-initiator with a low molecular weight (cf. U.S. Pat. No. 3,551,311). These adhesives suffer from the drawback of providing rigid and brittle films because of the high functionality of the unsaturated molecules which they contain. Furthermore, there also remains here a considerable quantity of acrylic unsaturation which has still not been polymerized and which is capable of leading to a rapid ageing and a premature loss of adhesive properties. This explains why these adhesives have hitherto not been used in practice.

Hitherto, contact or pressure-sensitive adhesives have been in the form (a) of solutions in organic solvents, (b) of aqueous dispersions or (c) of adhesive compositions without solvents which are applied at high temperature. In case (a), the evaporation of the solvent leads to a pollution of the environment unless very expensive post-combustion furnaces are used. In case (b), the elimination of the water requires a considerable expenditure of energy because of the high latent heat of vaporization of water. In case (c), the adhesive compositions, in order to be applied at room temperature, must have a sufficiently low molecular weight to impart a sufficiently low viscosity which permits convenient application thereof. However, the resistance to flowing of adhesives under mechanical stress is bound up with their molecular weight (cf. D. H. Kaelble "Physical Chemistry of Adhesion", pub. Wiley-Interscience, New York, 1971, page 392 et seq.). That is why, in order to obtain a good resistance to flowing of the adhesive, it is necessary to give it a sufficiently high molecular weight; in this case, the adhesive has a viscosity such that it is not possible to apply it at room temperature. Therefore, in order to lower the viscosity, it is necessary to heat it to a high temperature, which gives rise to risks of oxidation and decomposition.

British Pat. Specification No. 886,003 describes yet a further category of lamination or contact adhesives which are capable of drying under the influence of ultra-violet light. They contain (a) natural or synthetic rubber or a polyacrylic or polymethacrylic ether or ester with a lower molecular weight, (b) an initiator or sensitizer and (c) an important amount of solvent. When sticking with this adhesive, the solvent is first eliminated at room temperature, whereafter the adhesive is irradiated by ultra-violet light in an inert atmosphere. Therefore, strictly speaking, it is not a "solvent-free" adhesive because it is necessary to use it in the form of a solution in a volatile solvent. Therefore, problems of pollution also arise in this case. Furthermore, the speed of drying of the adhesive is very low.

Various attempts have been made to replace the organic solvent by a non-volatile substance which is incorporated by polymerization in the molecule of the adhesive polymer during the drying by ultra-violet radiation. R. Dowbenko et al. (Chemical Technology, 539–543/1974) describe such compositions in which the volatile solvent is replaced by a polymerizable acrylic or vinyl monomer. However, these compositions are not very reactive, despite the fact that the drying is carried out in the absence of air. In the opinion of the authors themselves, the resistance to ageing is also very low because the adhesive properties decrease rapidly as time goes on.

It is, therefore, an object of the present invention to provide photopolymerizable compositions which can be used as lamination adhesives or contact adhesives, which possess excellent adhesive properties and, at the same time, all the advantages of the known photopolymerizable adhesives with regard to stability on storage, non-pollution and immediate adhesivity, and which have a very high reactivity even in the presence of air, as well as a high resistance to ageing.

This object is achieved with the halogenated photopolymerizable adhesives according to the present invention, which comprise:

(a) 20 to 70% by weight of at least one halogenated polymer, which:
  (1) has a chain interrupted by at least one oxygen or nitrogen atom,
  (2) contains from 4 to 70% by weight of halogen atoms attached to carbon atoms having the electronic configuration $sp^2$, (3) has an average molecular weight between about 700 and about 10,000 and (4) has a glass transition temperature (Tg) between about −80° C. and 20° C.;
(b) 5 to 30% by weight of at least one organic monomer compound containing at least two acrylic and/or methacrylic acid radicals and containing from 0 to about 65% by weight of halogen atoms attached to carbon atoms having the electronic configuration $sp^2$;
(c) 20 to 70% by weight of at least one organic monomer compound containing an acrylic or methacrylic acid radical and containing from 0 to 65% by weight of halogen atoms attached to carbon atoms having the electronic configuration $sp^2$;
(d) about 1 to about 25% by weight of a photo-initiator system comprising:
  (1) 0.5 to 100% by weight of at least one aromatic ketone,
  (2) 0 to 99.5% by weight of at least one tertiary amine, at least one carbon atom of which, in the alpha position with regard to the nitrogen atom, carries at least one hydrogen atom,
  (3) 0 to 90% by weight of an aromatic or non-aromatic alpha-dione, the sum of (1) + (2) + (3) representing 100% by weight of the photoinitiator system, the total content of halogen atoms attached to carbon atoms having the electronic configuration $sp^2$ amounting to from about 3 to about 50% by weight of the total halogenated photopolymerizable adhesive.

By "carbon atoms having the electronic configuration $sp^2$" are to be understood carbon atoms which have a plane trigonal spatial configuration and which, therefore, form part of a double bond $>C = C<$, which may be olefinic or aromatic. The halogen atoms which are carried by such carbon atoms are here called "active halogen atoms". However, there is no reason at all why a compound should not contain both active halogen atoms and halogen atoms carried by carbon atoms with an electronic configuration $sp^3$, provided that the conditions given above regarding the content of active halogen atoms of the polymer (a) and of the total composition are fulfilled.

By "glass transition temperature" is to be understood the temperature from which a brittle and hard polymer is converted into a rubbery or viscous polymer in which the movements of portions of the polymer chain are not greatly hindered by interaction between chains (cf. P. J. Flory, Principles of Polymer Chemistry, pub. Cornell University Press, Ithaca 1969, p.56). This temperature, which characterizes the polymer, is determined, in the present invention, by the differential thermal analysis method described, in particular, by H. Burrell, Off.Dig. 34,131–161/1962. This method is well suited to polymers which have a Tg which is lower than room temperature. In the case of polymers with a Tg higher than or approximately equal to room temperature, the thermomechanical analysis described by W. de Marteau, Chimie des Peintures, 35, 245–249/1972 can also be used but it tends to give results which are systematically lower than those which are obtained by differential thermal analysis.

Halogenated polymer (a)

Examples of halogenated polymers (a) used according to the present invention are described, in particular, in Chapters 7 and 8 of "The Chemistry and Uses of Fire Retardants" by J. W. Lyons, pub. Wiley-Interscience, New York, 1970. However, of these substances, the only polycondensation or polyaddition products which can satisfy the requirements of the present invention are those which: have a polymer chain interrupted by at least one oxygen or nitrogen atom, contain 4 to 70% by weight of active halogen atoms, have a molecular weight of about 700 to about 10,000 and have a glass transition temperature (Tg), the upper limit of which is 20° C. and the lower limit of which is about −80° C.

The polymers the chain of which is interrupted by oxygen or nitrogen atoms include polymers obtained by non-radical condensation and addition methods. Most of the raw materials used for synthesizing these polymers are commercially available at reasonable prices. It is for this reason that the polymers derived therefrom are preferred for use in the compositions according to the present invention.

As stated above, the content of active halogen atoms in the halogenated polymer (a) is from 4 to 70% by weight. Since the photopolymerization activity of the photopolymerizable composition according to the present invention increases with the increase in halogen content of the halogenated polymer (a), it is of interest to use halogenated polymers (a) with a halogen content in the upper part of the range mentioned above.

The molecular weight of the halogenated polymer (a) is between about 700 and about 10,000. Below a molecular weight of 700, the reactivity of the composition containing the polymer (a) is insufficient. On the other hand, when the halogenated polymer (a) has a molecular weight greater than 10,000, the rheological properties are such that their application on to a substrate becomes difficult. In view of the comparatively high molecular weight of the halogenated polymers (a), they have the advantage, as compared with non-polymer halogenated compounds, that they have a very low vapor pressure and do not give rise to intoxication and pollution problems.

With regard to the glass transition temperature of the halogenated polymer (a), which ranges from about −80° C. to 20° C., we have found that when it is higher than 20° C., the flexibility of the total composition, as obtained after drying with visible or ultra-violet light, decreases considerably to the point that the film becomes stiff and brittle.

Among the halogenated polymers (a) which can be used according to the present invention, mention may be made of the polyhalophenylene ethers described in French Patent No. 1,384,255 and in German Offenlegungsschrift No. 2,021,830; the resins obtained by the condensation of the reaction product of pentachlorophenol, acetone and hydrochloric acid with epichlorohydrin in accordance with Japanese Patent Application No. 26,311/1968; the products resulting from the bromination of the polyaddition products of tolylene diisocyanate with a halogenated or non-halogenated diol, thus giving a brominated polyurethane; and the polycarbonates obtained by reacting pentachlorophenol, bisphenol A and phosgene, this reaction being described in Belgian Patent No. 699,028. However, for various reasons, such as the accelerating activity of photopolymerization, the ease of use, the availability and the cost of raw 1,4,5,6,7,7-hexachloro-bicyclo[2,2,1]-5-heptene and the like;

(5) alcohols in the form of epoxy compounds of the formula:

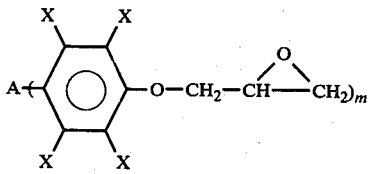

wherein X is a hydrogen or halogen atom, at least one X being a halogen atom; m is 1 or 2, and when m is 1, then A is X and when m is 2 then A is a simple bond or an alkylene radical containing 1 to 5 carbon atoms.

Examples of these epoxy compounds include the following: the bisglycidyl ether of 2,2-bis(3,5-dichloro-4-hydroxyphenyl)-propane, the bis-glycidyl ether of 2,3,5,6,2',3',5',6'-octachloro-4,4'-(dihydroxy-biphenyl and the glycidyl ethers of pentachlorophenol and pentabromophenol.

When the acid component of the halogenated polymer (a) does not contain any active halogen atom, this acid component may be, for example:
(1) a monocarboxylic acid, such as acetic acid, monochloroacetic acid, dichloroacetic acid, trichloroacetic acid, propionic acid, butyric acid, vinyl-acetic acid, acrylic acid, methacrylic acid, benzoic acid, phenoxyacetic acid or the like;
(2) a dicarboxylic acid, such as glutaric acid, succinic acid, adipic acid, sebacic acid, maleic acid, fumaric acid, citraconic acid, itaconic acid, mucochloric acid, phthalic acid, isophthalic acid, terephthalic acid, tetrahydrophthalic acid or the like;
(3) a tricarboxylic acid, such as trimellitic acid or the like;
(4) a tetracarboxylic acid, such as pyromellitic acid or the like; it being understood that, instead of the free acids, it is also possible to use their functional derivatives, such as the anhydrides, acid chlorides, esters or the like. When the acids are in the form of the acid chlorides, it is not essential to use phenols in their oxyethylated or oxypropylated form. In fact, it is possible to react a halogenated bisphenol with an acid dichloride in the presence of a tertiary amine in accordance with the method described in Belgian Patent No. 708,369.

When the alcoholic component of the halogenated polymer (a) does not contain any active halogen atoms, this component can be, for example:
(1) a monohydric alcohol, such as methanol, ethanol, n-propanol, isopropanol, n-butanol, isobutanol, 2-ethylhexanol, benzyl alcohol, allyl alcohol, a diallyl ether of trimethylolpropane or the like;
(2) a dihydric alcohol, such as ethylene glycol, propylene glycol, 1,4-butanediol, 1,6-hexanediol, neopentyl glycol, hydrogenated bisphenol A, tricyclodecanedimethanol (TCD-alcohol DM of Farbwerke Hoechst) and the like.
(3) a trihydric alcohol, such as glycerol, trimethylolethane, trimethylolpropane or the like;
(4) a tetrahydric alcohol, such as pentaerythritol or the like;
(5) a pentahydric, hexahydric or higher alcohol, such as dipentaerythritol, sorbitol or the like;
(6) an ether-alcohol, such as an addition product of ethylene oxide or of propylene oxide with an alcohol, examples of which are given above, as well as with a phenol, such as phenol, p,p'-bis-2,2'-isopropylidene-diphenol or the like;
(7) certain alcohols may be used in the form of epoxy compounds, such as ethylene oxide, propylene oxide, epichlorohydrin, the bisglycidyl ether of 2,2-bis-(4-hydroxyphenyl)-propane or the like.

However, according to the present invention, it is also possible to use, at the same time, for the preparation of the polymer (a), an acid with active halogen atoms and an acid having no active halogen atoms, as well as an alcohol with active halogen atoms and an alcohol having no active halogen atoms, provided that the polymer (a) thus obtained satisfies the conditions imposed above, i.e. has a polymer chain interrupted by at least one oxygen or nitrogen atom, contains 4 to 70% by weight of active halogen atoms, has a molecular weight of from about 700 to about 10,000 and has a glass transition temperature between about $-80$ and $+20°$ C.

The halogenated polymers (a) used in the adhesive according to the present invention may be classed into the following three categories:
(1) containing an unsaturation, which ensures a rapid polymerization,
(2) containing an unsaturation, which ensures a moderate polymerization,
(3) not containing any polymerizable unsaturation.

In the first category, the unsaturation is that provided by the acrylic esters or acrylamides. In this case, polymerization takes place at great speed and the photochemical reactivity is very high. Sometimes an adhesive is obtained with acceptable properties but, in the case of excessive irradiation, the adhesion decreases and may become zero after a few days.

In the second category, the unsaturation is that provided by compounds containing methacrylic, methacrylamide, maleic, fumaric or allyl radicals. Although they are less sensitive to an overdosage of ultra-violet irradiation, the loss of adhesion is, nevertheless, still marked. Furthermore, a marked decrease in the photochemical reactivity is observed.

In the third category, there is no polymerizable unsaturation and we have made the surprising discovery that the halogenated polymers (a) of this category combine a high photochemical reactivity with the production of lamination or contact adhesives possessing high adhesive properties capable of preserving all their properties, despite a possible overdosage of ultra-violet rays, and ageing during storage. It is, therefore, the halogenated polymers (a) of the third category which are preferred in the present invention, it being observed that the halogenated polymers (a) of the first and second categories are also of interest, provided that excessive irradiation is avoided. According to another aspect, the saturated halogenated polymers (a) offer the advantage of starting off from less expensive raw materials and of being manufactured more economically on an industrial scale than the related halogenated polymers (a) of the first and second category containing a photopolymerizable unsaturation, it being possible, in particular, for the latter to gel as a result of a premature polymerization. It will be observed that the halogenated polymers (a) of the third category always contain an aromatic, alicyclic or olefinic unsaturation substituted by halogen atoms but this unsaturation is not polymerizable by the radical method and, therefore, does not suffer from the drawmaterials, preference is given, according to the present invention, to halogenated polyesters which are obtained by the polycondensation of at least one monocarboxylic and/or polycarboxylic acid (or functional derivatives thereof, such as the anhydrides, acid chlorides, esters or the like) with at least one monohydric and/or polyhydric alcohol; in this case, the acid component, the alcohol component or possibly both components will contain active halogen atoms, so that the halogenated polymer (a) thus obtained has the required content of active halogen atoms of 4 to 70% by weight. Halogen is to be understood to mean fluorine, chlorine, bromine and iodine; however, for economic reasons and reasons of each of supply, it is preferred to use acids and/or alcohols containing active chlorine or bromine.

As acids containing active halogen atoms, use may be made, according to the present invention, of the following compounds:

(1) acids of the formula:

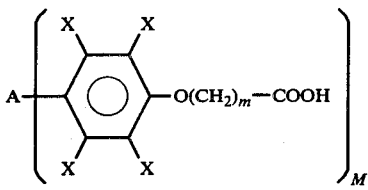

wherein X is a hydrogen or halogen atom, at least one X being a halogen atom, A is the same as X, or, when M = 2, represents a simple bond or an alkylene radical containing 1 to 5 carbon atoms, M is 1 or 2 and m is 1 to 3.

Examples of these acids include 2,4,6-trichlorophenoxyacetic acid, 4-(pentabromophenoxy)-butyric acid, 3,5,6,2',3',5',6'-octachloro- or octabromo-4,4'-(3-carboxypropoxy) biphenyl, 2,2-bis-[3,5-dichloro-4-(2-carboxyethoxy)phenyl]-propane and the like;

(2) acids of the formula:

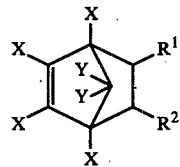

in which X is a halogen atom, Y is a hydrogen or halogen atom, $R^1$ is $(R^3)_n$COOH, in which n is 0 or 1 to 8, $R^3$ is $-CH_2-$ or $-CH=CH-$ and $R^2$ is the same as $R^1$ or is a hydrogen atom or a methyl radical.

Examples of these acids include 1,4,5,6,7,7-hexachloro-bicyclo[2,2,1]-5-heptene-2,3-dicarboxylic acid (HET acid of the Hooker Chemical C°), 1,4,5,6,7,7-hexachloro-bicyclo[2,2,1]-5-heptene-2-carboxylic acid, 1,4,5,6,7,7-hexachloro-bicyclo[2,2,1]-5-heptene-2-acetic acid, 1,4,5,6,7,7-hexachloro-bicyclo[2,2,1]-5-heptene-2-pelargonic acid, 1,4,5,6,7,7-hexachloro-bicyclo[2,2,1]-5-heptene-2-acrylic acid, 1,4,5,6-tetrachloro-bicyclo[2,2,1]-5-heptene-2,3-dicarboxylic acid, 1,4,5,6,7,7-hexabromo-bicyclo[2,2,1]-5-heptene-2,3-dicarboxylic acid, 1,4,5,6,7,7-hexachloro-3-methyl-bicyclo[2,2,1]-5-heptene-2-carboxylic acid and the like;

(3) the following acids and anhydrides: 3,5-dibromo-salicylic acid, tetrachlorophthalic acid (Tetrathal of Monsanto), tetrabromophthalic acid (Firemaster PH4 of Michigan), 2,3-dicarboxy-5,8-endomethylene-5,6,7,8,9,9-hexachloro-1,2,3,4,4a,5,8,8a-octahydronaphthalene anhydride (Chloran of UOP Chemical), dichloromaleic anhydride and the like.

As alcohols containing active halogen atoms, use may be made, according to the present invention, of the following compounds:

(1) addition products of 1 to 10 moles of ethylene oxide or propylene oxide with monocarboxylic or polycarboxylic acids containing active halogen atoms, such as those which have been mentioned above by way of example, particular mention being made of the addition products of ethylene oxide or propylene oxide with to Diels-Alder cycloaddition acids of hexachlorocyclopentadiene, such as are described in U.S. Pat. No. 3,278,580.

(2) halogenated alcohols of the formula:

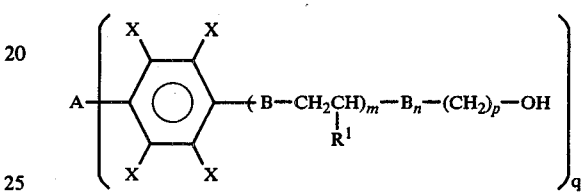

wherein X is a hydrogen, chlorine or bromine atom, at least one X being a halogen atom; A is X or, when q is 1, A is T,101 whereas when q is 2, A is an alkylene group containing 1 to 5 carbon atoms or is a simple bond; B is an oxygen atom or an imino (NH) group; m is 0 to 1 to 10; $R^1$ is a hydrogen atom, a hydroxyl group or a methyl radical; n is 0 when m is not 0 and n is 1 when m is 0; p is 0 to 5, with the proviso that when m is 0 then p is $\geq 2$ and when p is 0 then m is $\geq 1$; and q is 1 or 2.

Examples of these halogenated alcohols include the following: 2-(4-chlorophenoxy)-ethan-1-ol, 4-(2,4,6-trichlorophenoxy)-butan-1-ol, 3-(pentachlorophenoxy)-propan-1-ol, 2-[2-(2-(2,4,6-tribromophenoxy)-ethoxy)-ethoxy]-ethan-1-ol, 3-(pentachlorophenoxy)-propan-1,2-diol, 3,5,6,2',3',5',6'-octachloro-4,4'di-(2-(2-hydroxyethoxy)-ethoxy)-biphenyl (Decadiol 02A of Caffaro), 3,5,6,2',3',5',6'-octachloro-4,4'-di-(2-hydroxyethylamino)-biphenyl (Decadiol 111 of Caffaro), 2,2-bis-[3,5-dichloro-4-(2-hydroxethoxy)-phenyl]-propane, 2,2-bis-[3,5-dibromo-4-(2,3-dihydroxypropoxy)-phenyl]-propane, 1,4-bis-(2-hydroxypropoxy)-2,3,5,6-tetrachlorobenzene, and the like;

(3) 1,2,3,5-tetrachlorobenzene-4,6-dimethanol;

(4) alcohols of the formula:

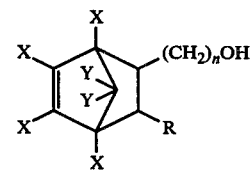

wherein X is a chlorine or bromine atom; Y is a hydrogen, chlorine or bromine atom; R is a hydrogen atom, a methyl radical or a $(CH_2)_n$OH radical and n is 1 to 4.

Examples of these halogenated alcohols include the following: 1,4,5,6,7,7-hexachloro-2,3-bis-(hydroxymethyl)-bicyclo[2,2,1]-5-heptene (Diol HET marketed by the Hooker Chemical C°), 2-(3-hydroxybutyl)- backs of the compounds containing polymerizable or copolymerizable unsaturation.

Preparation of the halogenated polymer (a)

For the mode of preparation of polyhalophenylene ethers, reference is made to French Patent No. 1,384,255 mentioned hereinbefore.

For the condensation of pentachlorophenol with acetone, hydrochloric acid and epichlorohydrin, reference is made to Japanese Patent Application No. 26,311/1968 already mentioned above.

The preparation of the halogenated polyurethanes is described in Kirk-Othmer, Encyclopedia of Chemical Technology, 2nd edition, vol. 21, pp. 56 to 106.

The preparation of the halogenated polymer (a) in the form of a polyester is carried out as described in Kirk-Othmer, loc.cit., vol.16, pp.159 to 189.

When the halogenated polymer (a) is a polyester prepared from an anhydride of a halogenated acid and an epoxy compound in the presence of a tertiary amine as catalyst, the method of preparation used may be that described by R. F. Fischer in J. of Polymer Science, 64,155–172/1960.

However, to prepare the halogenated polyesters which are the preferred halogenated polymers (a) for the present invention, the following method of operation may also be used.

In a conventional polycondensation apparatus equipped with a stirrer, an inert gas supply (for example nitrogen), a thermometer, an azeotropic distillation device (for example a Dean-Stark apparatus), there are first placed the acids and alcohols which are to be polyesterified and possibly also a catalyst. According to whether the polyesterification is carried out in the presence or absence of a solvent, on the one hand, according to whether the acid component is used in the form of the free carboxylic acid, an alkyl ester, an acid chloride or an anhydride, or the alcohol in the form of an epoxy compound, on the other hand, the operating conditions will vary.

Thus, when using the acid in the free state or in the form of an anhydride, polyesterification is carried out at a temperature which may be from 60 to 250° C., initially at atmospheric pressure and, towards the end of the reaction, under reduced pressure, for 0.5 to 100 hours; if this polyesterification has been carried out in bulk, the hot resinous product thus obtained is cast into drums or is mixed directly, whilst hot, with the other components (b), (c) and (d) of the photopolymerizable adhesive according to the present invention; if this polyesterification has been carried out in the presence of an azeotropic solvent, such as benzene or toluene, in the absence or in the presence of an esterification catalyst, such as sulfuric acid or p-toluene-sulfonic acid, it is necessary, at the end of the reaction, to eliminate the solvent, the catalyst and unreacted reagents by distillation under reduced pressure, by washing or by neutralization.

If the acid and/or the alcohol are used in the form of a monomeric ester, it is also possible to operate in bulk in the manner described above or in the presence of a catalyst and possibly of a solvent, it being possible for the latter to be an inert organic solvent, such as benzene, or one of the reagents in excess, for example the alcohol to be polyesterified. Examples of catalysts which can be used include potassium carbonate and alkyl titanates, for example the Tyzors of E. I. du Pont de Nemours & Co. The operating conditions (temperature, pressure and duration) are more or less the same as for the polyesterification with the free acid or with the acid anhydride.

For the polyesterification starting from an acid chloride, the polymerization reaction can be carried out in a single phase in the presence of an inert organic solvent and of a tertiary amine, such as triethylamine, pyridine or the like, or in two phases, using known techniques of interfacial polyesterification. It is usual to operate at a temperature equal to or lower than room temperature, at atmospheric pressure and for a time which may range from the time necessary for the addition of the reagents to a few hours. The hydrochloride of the tertiary amine thus formed is then removed by filtration, the solvent is distilled off and the polyester obtained is recovered in the form of a residue from this distillation.

When the alcohol is used in the form of an epoxy compound, it is possible to operate in the presence or absence of a solvent and in the presence of a tertiary amine as catalyst, such as triethylamine, pyridine or the like, the polyesterification mixture being heated to a temperature of 60° to 250° C. at atmospheric pressure or under an increased pressure if the epoxy compound is gaseous at the reaction temperature; in the latter case, the reaction is carried out in an autoclave. The reaction time may vary from 0.5 to 100 hours, according to the nature of the reagents used.

The halogenated polymer (a) is an essential constituent of the composition according to the present invention. In fact, we have made the surprising discovery that this not only considerably improves the reactivity of the acrylic compounds (b) and (c) of the compositions towards visible or ultra-violet irradiation but also imparts to the adhesive film adhesive properties such that the use of a vinyl polymer, a natural rubber, a styrene-butadiene or acrylic elastomer, which hitherto have been used in adhesive compositions, is no longer necessary. Furthermore, the resistance to an overdosage of ultra-violet rays is such that it is possible, where necessary, to print a design with an ink which is capable of drying, under the effect of ultra-violet rays, on the transparent film of the laminated product without causing a deterioration in the properties of the lamination adhesive. Finally, the resistance to ageing of the lamination adhesives or contact adhesives is excellent, probably because the high reactivity which is imparted by the polymer (a) is such that the conversion of the acrylic and/or methacrylic unsaturations is immediately very high. This considerably reduces the possibility of a polymerization subsequent to the drying by ultra-violet rays, which would cause a deterioration in the adhesive properties over the course of time.

Organic monomer component (b)

As stated above, the photopolymerizable compositions according to the present invention contain 5 to 30% by weight of at least one organic monomer compound containing at least two radicals of acrylic and/or methacrylic acid and 0 to about 65% by weight of halogen atoms attached to carbon atoms having the electronic configuration $sp^2$.

The compound (b) is a condensation product of (1) at least one polyalcohol containing 2 to 6 hydroxyl groups with (2) at least one alpha,beta-ethylenically unsaturated monocarboxylic acid containing 3 or 4 carbon atoms and possibly with (3) at least one organic mono- to tetracarboxylic acid, the polyalcohol (1) and/or the organic mono- to tetracarboxylic acid (3) either containing or not containing active halogen atoms, in such a way that the compound (b) contains from 0 to about 65% by weight thereof.

The polyalcohol (1) may be dihydric, such as ethylene glycol, propylene glycol, 1,4-butanediol, 1,6-hexanediol, neopentyl glycol or the like; trihydric, such as glycerol, trimethylolethane, trimethylolpropane or the like; tetrahydric, such as pentaerythritol or the like; pentahydric or hexahydric, such as dipentaerythritol, sorbitol or the like.

When the polyalcohol (1) is halogenated, this may be selected from among the alcohols containing active halogen atoms, already mentioned for the preparation of the halogenated polymer (a).

The alpha,beta-ethylenically unsaturated monocarboxylic acid (2) containing 3 or 4 carbon atoms is methacrylic acid or, preferably, acrylic acid.

The mono- to tetracarboxylic organic acid (3) may be a monocarboxylic acid, such as acetic acid, propionic acid or the like; a dicarboxylic acid, such as succinic acid, adipic acid, phthalic acid or the like; a tricarboxylic acid, such as trimellitic acid or the like; a tetracarboxylic acid, such as pyromellitic acid or the like; a more complete list of these acids has already been given above for the synthesis of the halogenated polymer (a).

When this mono- to tetracarboxylic organic acid (3) contains active halogen atoms, it is selected from among those already mentioned for the preparation of the halogenated polymer (a).

Examples of the organic monomer compound (b) containing at least one polyalcohol (1) and at least one alpha,beta-ethylenically unsaturated monocarboxylic acid (2) include the following: diacrylates and dimethacrylates of ethylene glycol, of diethylene, triethylene, tetraethylene or polyethylene glycols, of dipropylene or polypropylene glycols, of butanediols, of hexanediols, of neopentyl glycol, of oxyethylated or oxypropylated bisphenol A; the triacrylates and trimethacrylates of trimethylolethane, of glycerol or of trimethylolpropane or the like; and the tetraacrylates and tetramethacrylates of pentaerythritol. The acrylates and methacrylates of the oxyethylation or oxypropylation products of these polyalcohols can also be used. Mention is also to be made of the diacrylates, triacrylates, tetraacrylates and methacrylates of the bis-glycidyl ethers of bisphenol A and F and the like. As examples of polymerizable halogenated esters, mention may be made of the diacrylate and dimethacrylate of 2,3,5,6,2',3',5',6'-octachloro-4,4'-di-(2-(2-hydroxyethoxy)-ethoxy)-biphenyl (Decadiol 02A of Caffaro).

As examples of the organic monomer compound (b) which contains at the same time at least one polyalcohol (1), at least one alpha, beta-ethylenically unsaturated monocarboxylic acid (2) and at least one mono- to tetracarboxylic organic acid (3), mention may be made of the condensation product of a mole of adipic acid, 2 moles of pentaerythritol and 6 moles of acrylic acid or methacrylic acid; the condensation product of a mole of $C_{36}$ dimer acid (Empol 1010 of Unilever-Emery), 2 moles of pentaerythritol and 6 moles of acrylic acid or methacrylic acid and the like. As examples of a mixed ester of this type containing active halogen atoms, mention may be made of the condensation product of 1 mole of tetrachlorophthalic anhydride, 2 moles of diethyleneglycol and 2 moles of acrylic acid or methacrylic acid or the like.

The organic monomer component (b) preferably has a low vapor pressure so that the practical use of the composition according to the present invention does not cause any trouble (odor or intoxication) to the user.

The essential part played by the organic monomer component (b) is to form, after irradiation with visible or ultra-violet light, a cross-linked network which will support the non-polymerizable components and the non-polymerized residues of the composition according to the present invention so as to obtain a film of material which is dry and sufficiently cohesive to avoid any flowing, even under permanent stress (shearing or tensile flowing).

When the content of component (b) exceeds 30% by weight, the speed of drying of the adhesive film is acceptable but this film becomes too hard and too stiff; the adhesion to the substrate decreases considerably and the flexibility becomes insufficient. On the other hand, when the content of component (b) is less than 5% by weight of the composition according to the present invention, the speed of polymerization becomes insufficient, with, as a consequence, a prohibitive investment in lamps for emitting ultra-violet light or a lower rate of production.

Organic monomer component (c)

The component (c) is at least one monoacrylate or monomethacrylate of monohydric or polyhydric aliphatic, alicyclic or aromatic alcohols. They are compatible with the components (a) and (b) of the adhesive according to the present invention and form true solutions with them. According to requirements, 20 to 70% by weight thereof, referred to the total composition, can be used.

The component (c) is added as a co-reactive diluent to modify the rheology of the total composition, as an adhesion promotor, as a co-reactive internal plasticizer or to increase the reactivity, for example by using component (c) containing active halogen atoms.

More particularly, as regards the monoacrylates or monomethacrylates of monohydric alcohols, from the point of view of reactivity, they may all be used, whatever the alkyl radical of these esters. However, as regards the practical use of the component (c) in contact adhesives, those esters will not be used which could present problems of odor and/or of toxicity, particularly because of their having too high a vapor pressure under the conditions of use or because of their solubility in water. Thus acrylic acid, methacrylic acid, $C_1$ to $C_6$-alkyl acrylates and furfuryl acrylate will not be used for this reason. Therefore, use is preferably made of acrylates or methacrylates with a low vapor pressure, for example 2-ethylhexyl, lauryl, stearyl, benzyl, 2-phenoxyethyl, 2-[4-(n-nonyl)phenoxy]ethyl, 2-phenoxy(polyethoxy)-ethyl, diethylene glycol monoethyl ether, and the like acrylates or methacrylates.

More particularly, as regards the monoacrylates or monomethacrylates or polyhydric alcohols, practically all of them satisfy the requirement of a very low vapor pressure at the temperature of use of the compositions according to the present invention. As polyhydric alcohols, use may be made of all those which have already been mentioned above for the synthesis of compounds (a) and (b). By way of examples, mention may be made of the monoacrylates and monomethacrylates of diols, such as, 1,4-butanediol and 1,6-hexanediol; of triols, such as glycerol, trimethylolpropane and the like; and all their oxyethylation and oxypropylation products. Use may also be made of hydroxyl group-containing vinyl polymers, for example the copolymer of butyl acrylate (39.2 mole percent), ethyl acrylate (58.8 mole percent) and 2-hydroxyethyl acrylate (1.01 mole percent), the molecular weight of which is limited to 13,000 by dodecylmercaptan (0.92 mole percent). Since there still remains at least one free hydroxyl group in the molecule of the monoacrylate or monomethacrylate of the polyhydric alcohol, it is possible to react these excess hydroxyl groups with other monofunctional reactive compounds and thus to make the molecule larger, examples of these including monoisocyanates, such as phenyl isocyanate or the like; acid anhydrides, such as phthalic anhydride, maleic anhydride or the like; and acid chlorides, such as acetyl chloride or the like. As a particular example, mention may be made of the esterification product of one molecule of 2-hydroxyethyl acrylate with one molecule of phthalic anhydride or the like.

If the adhesives according to the invention are used for lamination, the toxicity and volatility requirements of the components of the adhesive are much less strict. Indeed:

(1) polymerization takes place in the absence of atmospheric oxygen and consequently the inhibiting influence of the latter is practically avoided, thence the rate of conversion of the ethylenic unsaturation is much improved as compared with a polymerization in the presence of air; in other words, the content in residual monomers is very much reduced;

(2) moreover, most of the films of plastic materials constitute a tight barrier preventing the migration of any residual monomers out of the laminate. The contamination hazard, by contact of the laminate with e.g. foodstuffs is very much reduced, even inexistent, all the more that the amount of adhesive used for the manufacture of laminates is always very low.

It is thus possible to use polymerizable monomers, that would not have been accepted for contact adhesives, such as ethylene glycol or propylene glycol monoacrylates or monomethacrylates, provided, of course, they do not substantially reduce the resistance to pasteurization or sterilization of the formed laminate.

As stated above, the component (c) may also contain active halogen atoms so that the total composition according to the present invention contains a sufficient number of active halogen atoms to comply with the range mentioned above of 3 to 50% by weight. The component (c) with active halogen atoms which can be used includes that which results from the esterification of a molecule of acrylic acid or methacrylic acid with a molecule of a monohydric or polyhydric compound (or a monoepoxide or polyepoxide equivalent thereof) containing active halogen atoms, such as those which have already been mentioned for the preparation of components (a) and (b). Specific examples include the monoacrylates and monomethacrylates of 3-(pentachlorophenoxy)-propan-1-ol, 3-(2,4,6-tribromophenoxy)-propan-1,2-diol, 2-(3-hydroxybutyl)-1,4,5,6,7,7-hexachlorobicyclo-[2,2,1]-hept-5-ene, the addition products of 2-hydroxyethyl acrylate or methacrylate with tetrachlorophthalic anhydride or tetrabromophthalic anhydride or the like. Compounds (c) containing active halogen atoms can also be obtained by esterifying glycidyl acrylate or methacrylate with an acid containing active halogen atoms, such as those which have already been mentioned above with regard to compounds (a) and (b). Specific examples include the reaction product of glycidyl acrylate with 2,4,6-trichloro-phenoxyacetic acid, 1,4,5,6,7,7-hexachloro-bicyclo[2,2,1]-hept-5-ene-2,3-dicarboxylic acid or the like.

In conclusion, the necessary content of active halogen atoms of the composition according to the present invention is provided by components (a), (b) and (c) but it is absolutely necessary for component (a) to contain at least 4% by weight of active halogen atoms. If the total composition does not contain sufficient active halogen atoms provided by the component (a), this deficit will be made good by using components (b) or (c) containing active halogen atoms. However, it is possible and even advantageous for the components (a), (b) and (c) each to provide active halogen atoms because, as stated above, there is a distinct relationship between the content of active halogen atoms of the total composition according to the present invention and the speed of photopolymerization of the latter by actinic light.

Photo-initiator system (d)

The adhesives according to the present invention contain from 1 to 25% by weight of a photo-initiator system (d). This photo-initiator system makes it possible considerably to accelerate the drying under visible or ultra-violet light of the adhesive layers formed with the halogenated photopolymerizable adhesive according to the present invention. As already stated above, the photo-initiator system (d) contains:

(1) 0.5 to 100% by weight of at least one aromatic ketone, (2) 0 to 99.5% by weight of at least one tertiary amine, at least one carbon of which, in the alpha position with regard to the nitrogen atom, carries at least one hydrogen atom, (3) 0 to 90% by weight of at least one aromatic or non-aromatic alpha-dione, the sum of (1) + (2) + (3) representing 100% by weight of the photo-initiator system.

Aromatic ketones which can be used include acetophenone, propiophenone, 2-phenyl-acetophenone, 2-chloro-2-phenyl-acetophenone, 2,2-dichloro-2-phenyl-acetophenone, 2-butyloxy-2-phenylacetophenone, 2,2-dimethoxy-2-phenylacetophenone, 2,2-diethoxy-acetophenone, 2-methylol-2-methoxy-2-phenyl-acetophenone, 2-hydroxy-2-phenyl-acetophenone, benzophenone, 4-trichloromethylbenzophenone, indenone, 1,3-indandione, fluorenone, xanthone, thioxanthone, 2-chlorothioxanthone, anthraquinone, 2-ethyl-anthraquinone, 1,6-hexanediol acrylate o-benzoylbenzoate and the like.

The photo-initiating action of these aromatic ketones is greatly improved by tertiary amines having at least one hydrogen atom on the carbon atom next to the nitrogen atom. Tertiary amines which can be used include trimethylamine, triethanolamine, N-methyldiethanolamine, N,N'-dimethyl-ethanolamine, dimethyl-stearylamine, N,N-dimethylaniline and N,N'-di-(2-hydroxyethyl)-aniline.

The photo-initiating action of the above-mentioned aromatic ketones can also be greatly improved by the addition of at least one aromatic or non-aromatic alpha-dione, examples of which include biacetyl, glyoxal, indane-1,2-dione, p-chlorophenyl-glyoxal, benzil, camphoquinone and the like.

It may be advantageous in certain cases, to associate, in one and the same molecule, the tertiary amine function, at least one carbon atom of which, in the alpha position with regard to the nitrogen atom, carries at least one hydrogen atom, with the aromatic ketone function, for example 2-isopropyloxy-2-(4-dimethylaminophenyl)-propiophenone, 4-dimethylaminobenzophenone, 4,4'-bis-(dimethylamino)-benzophenone, N-methylacridone, 2-diethylamino-9-fluorenone, 7-diethylamino-4-methylcoumarin and the like. It is also possible to associate, in one and the same molecule, the tertiary amine function, at least one carbon atom of which, in the alpha position with regard to the nitrogen atom, carries at least one hydrogen atom, with at least one acrylic or methacrylic radical, for example the monoacrylates, diacrylates and triacrylates or methacrylates of triethanolamine, N-methyl-diethanolamine, N,N'-dimethyl-ethanolamine or N,N'-di-(2-hydroxyethyl)-aniline; or the mixed esters of acrylic acid and beta-dimethylaminopropionic acid with polyols, such as 1,4-butanediol, trimethylolpropane or the like.

Preparation of the halogenated photopolymerizable adhesive

To prepare the halogenated photopolymerizable adhesive according to the present invention, the above-mentioned quantities of compounds (a), (b), (c) and (d) can be mixed homogeneously with one another at room temperature, using known mixing apparatus. However, when the speed of mutual solution is deemed to be too slow at room temperature, it is possible to carry out this mixing operation at a moderately high temperature, making sure to avoid any premature polymerization. According to the nature of the compounds present, obtaining a homogeneous photopolymerizable composition requires a mixing time which may range from several minutes to a few hours.

Uses of the halogenated photopolymerizable adhesive

The halogenated photopolymerizable adhesive according to the present invention may be used advantageously as an adhesive for all the applications where a rapid polymerization is required, either individually or mixed with other products, such as (1) inert non-copolymerizable polymers, (2) inert plasticizers, (3) various additives and (4) transparent filler materials.

Since these other products are conventionally used in the manufacture of lamination and contact adhesives, the nature, the role and the amounts to be added are well known.

(1) Examples of inert non-copolymerizable polymers include the vinyl polymers or copolymers derived from vinyl acetate, vinyl chloride, styrene, acrylic acid or methacrylic acid, alkyl esters (methyl, ethyl, butyl, 2-ethylhexyl, decyl and the like) of these acids, N-vinylpyrrolidone and the like. Use may also be made of polybutylenes, polyisobutylenes, polyacrylonitriles, chlorinated rubbers and the like.

(2) Examples of inert non-copolymerizable plasticizers include the esters of organic or mineral acids, such as phthalic acid, iso- or terephthalic acid, adipic acid, azelaic acid, sebacic acid or phosphoric acid, with monohydric or polyhydric compounds, such as butanol, 2-ethyl-hexanol, phenol, cresol, diethylene glycol or the like. Use may also be made of plasticizers such as epoxidized oils, sulfonamide resins, abietic esters or rosin esters of pentaerythritol, coumarone-indene resins and polyterpene hydrocarbon resins or derivatives of cyclopentadiene, for example the Piccolytes, Piccopales and Piccoplastics of the Hercules Co.

(3) As various additives which may be added to the composition according to the present invention, mention may be made, by way of example, of known heat and light stabilizers, known anti-oxidants, chain transfer agents intended for controlling the length of the radical chain during the polymerization, for example tert.-butyl mercaptan, polymerization inhibitors intended to improve the storage stability, for example quinones, hydroquinones, substituted phenolic derivatives and the like.

(4) Transparent filler materials are selected that have a minimum absorption in the range from 200 to 400 nanometers. These are mainly finely-divided silica, precipitated or micronized calcium or magnesium carbonate (calcite, aragonite or the like), barium or calcium sulfate (barite, blanc fixe or the like), micronized hydrated potassium or magnesium silico-aluminate, micronized magnesium silicate, precipitated alumina hydrate, asbestine, micronized or unmicronized talc or the like.

The final lamination and contact adhesive composition according to the present invention comprises (in parts by weight):

| | |
|---|---|
| halogenated photopolymerizable adhesive (a + b + c + d) | 60 to 95 |
| inert polymers | 0 to 25 |
| inert plasticizers | 0 to 10 |
| various additives | 0 to 10 |
| filler materials | 0 to 40 |

The application of the adhesives according to the present invention intended for laminates may be carried out in thicknesses of 0.5 to 5 microns by means of a laminating machine, such as that which is described in Belgian Patent No. 776,938. Such an apparatus is capable of sticking together the two films, at least one of which is transparent to visible and ultra-violet radiations so that the polymerization of the adhesive according to the present invention may be initiated. Films transparent to visible or ultraviolet radiations which can be used include, in particular, polyethylene, polypropylene, cellulose, polyethylene terephthalate, polyvinyl chloride, polyamide films and the like. These films may or may not be oriented; their surface may or may not have undergone a prior treatment by a corona effect or it may or may not be covered with a coating of a primer. The films opaque to visible or ultra-violet radiations which may be used include metal films (treated and untreated aluminum, treated and untreated copper or the like), paper, cardboard, fabrics, pigmented plastics films which are opaque to visible or ultraviolet radiations or the like.

The application of the adhesives according to the present invention intended for contact adhesives is carried out, in particular, with the known roller painting machines in a thickness of 5 to 30 microns. The viscosity of the composition must then be adjusted in such a way that the deposited film is uniform. Hereinbefore examples have been given of films which are capable of being coated with these compositions. In certain cases, the contact adhesive film is applied on a silicone paper, then dried and thereafter laminated with paper or other non-silicone substrate. The silicone paper must be capable of being detached easily at the moment of use, without part or the whole of the adhesive remaining fixed thereto.

All sources of ultra-violet or visible light may be used for the polymerization of the adhesives of the present invention. However, the best results are obtained with medium-pressure mercury arc lamps with a power consumption of 80 to 200 watts per cm, the light emitted from which is focussed by a semi-elliptical reflector into a band a few cm wide at a distance of 7.5 cm from the lamp. It is more advantageous to pass the coated substrate in the focal plane of the lamp. It may also be advisable, especially in order to accelerate the speed of passage, to place several lamps one after the other. The speed of hardening below a single lamp may vary between a few centimeters per second and several meters per second, according to the requirements of the application, the reactivity of the formulation, the luminous intensity emitted by the lamp and the like.

The following Examples are given for the purpose of illustrating the present invention:

EXAMPLE 1

79 g (0.275 moles) tetrachlorophthalic anhydride, 133 g (0.9 moles) phthalic anhydride, 78 g (1.26 moles) ethylene glycol, 3.05 g (0.025 moles) benzoic acid and 50 ml benzene are placed in a 4-necked 500 ml round-bottomed flask equipped with a stirrer, a nitrogen inlet, a thermometer dipping into the mass and a Dean-Stark water separation column. The reaction mixture is gradually heated until the mass is liquefied (time = 0, temperature = 100° C.), whereafter stirring is started, whilst introducing nitrogen into the flask. After heating for 19 hours, the temperature of the mass is 150° C. The quantity of water distilled off is 11.5 ml and the acidity (alcoholic KOH) is 0.795 meqH$^+$/g. The intensity of the heating is increased so that, after one hour, the temperature reaches 185° C. The quantity of water distilled off is then 12 ml. The acidity of the solution (alcoholic KOH) is 0.73 meqH$^+$/g, which corresponds to a conversion rate of 91%. The benzene is distilled off under reduced pressure (temperature of the mass: 150° C.; pressure: 10 mm Hg), whilst maintaining an inert atmosphere. The flask is emptied whilst the polyester is still in the molten state and the polyester then allowed to cool. The polyester thus obtained is quite colorless.
Analysis:
acidity: 0.80 meqH$^+$/g.
Tg (differential thermal analysis): 20° C.
molecular weight at the top of the peak in GPC: 1700
theoretical active chlorine content: 14%.

EXAMPLE 2

A halogenated polyester is prepared, according to the general mode of operation of Example 1, from 11.2 mole percent tetrachlorophthalic anhydride, 27.5 mole percent phthalic anhydride, 9.2 mole percent adipic acid, 51.2 mole percent ethylene glycol, 0.98 mole percent benzoic acid and 2.5% by weight benzene. After 10 hours heating, the temperature is 190° C. and the acidity is 0.29 meqH$^+$/g, which corresponds to a conversion of 97%.
Analysis:
acidity: 0.30 meqH$^+$/g.
Tg (differential thermal analysis): 7° C.
molecular weight at the top of the peak in GPC: 3500
theoretical active chlorine content: 14.6%

EXAMPLE 3

A lamination adhesive is prepared, the composition of which is as follows:

| | |
|---|---|
| polyester of Example 1 | 60 parts by weight |
| diethylene glycol diacrylate | 20 parts by weight |
| 2-hydroxyethyl acrylate | 5 parts by weight |
| benzophenone | 5 parts by weight |
| mixed acrylate beta-dimethyl-aminopropionate ester of diethylene glycol | 10 parts by weight |

This composition is applied in a film with a thickness of 4μ, by means of a spiral scraper, onto untreated aluminum strips and then polypropylene strips are laminated onto these, using a glass rod.

The transparent side is then exposed to a Hanovia 80 W/cm medium-pressure mercury vapor lamp equipped with a semi-elliptic reflector. When the adhesive film is dry, the adhesion is such that the films of aluminum and polypropylene cannot be detached without the plastics film giving way. The reactivity of the adhesive, measured by the speed of passage under the lamp starting from which the films of the laminate may be detached without one or other of them giving way, is 2 meters per second. The force necessary for their separation, measured with an Instron apparatus, is higher than 300 g/cm at a speed of 5 cm per minute.
Resistance to overdosage
The adhesive remains just as adherent after 10 successive passages underneath the same lamp.
Resistance to ageing.
The adhesion of the films of the laminate is preserved after storage for one month at 45° C.

EXAMPLE 4 (comparative)

In the composition of Example 3, the halogenated polyester of Example 3 is replaced by a non-halogenated saturated polyester. This polyester has the following composition (in mole percent): 24.3 terephthalic acid, 9.4 trimellitic anhydride, 8.1 adipic acid, 45.9 ethylene glycol and 12.3 neopentyl glycol. The acidity is 0.03 meqH$^+$/g, the Tg (differential thermal analysis) is 19° C. and the molecular weight at the top of the peak in GPC is 2500.

A laminate was prepared under the same conditions as those of Example 3. After 5 passages underneath the Hanovia lamp at 1.0 m/second, the same adhesion rate is still not achieved as that obtained after a single passage of the adhesive of Example 3 based on a halogenated saturated polyester.

EXAMPLE 5

A contact adhesive is prepared, the composition of which is as follows:

| | |
|---|---|
| polyester of Example 2 | 50 parts by weight |
| neopentyl glycol diacrylate | 10 parts by weight |
| 2-(2-phenoxyethoxy)-ethyl acrylate | 25 parts by weight |
| benzophenone | 5 parts by weight |
| mixed acrylate beta-dimethyl-amino-propionate ester of diethylene glycol | 10 parts by weight |

This composition is spread on coated paper by means of a spiral scraper to give a coating of 24 microns thickness, the paper is cut into strips and the reactivity of the composition is determined by passing the strips at decreasing speeds under a Hanovia lamp until the film cannot be easily removed with the finger. The reactivity thus found is 1.1 meter per second. The surface of the film thus obtained is very sticky. In another experiment, the composition is spread on a sheet of silicone paper. The sheet thus coated is passed under a Hanovia lamp at a speed of 1.1 m/second, whereafter a film of polyethylene terephthalate is laminated onto the sticky surface by means of a roller. The polyethylene terephthalate film is then separated from the sheet of paper. The adhesive film is entirely transferred to the film of plastics material and the surface of the film thus obtained is very sticky.

EXAMPLE 6

A contact adhesive is prepared having the following composition:

| | |
|---|---|
| polyester of Example 1 | 30 parts by weight |
| unsaturated polyacrylate[(1)] | 60 parts by weight |
| tetraethylene glycol diacrylate | 5 parts by weight |
| benzophenone | 2 parts by weight |
| diethylene glycol acrylate beta-dimethylaminopropionate | 3 parts by weight |

[(1)]The unsaturated polyacrylate was prepared by esterifying with acrylic acid, in a yield of 92%, a copolymer prepared from ethyl acrylate (39.2 mole percent), butyl acrylate (58.8 mole percent), 2-hydroxy-ethyl acrylate (0.92 mole percent) and dodecyl mercaptan (0.92 mole percent). This unsaturated acrylate polymer contains an average of 1.0 acrylic double bond per molecule.

The composition is heated in an oven at 80° C. and then applied, by means of a spiral scraper of 12μ preheated to 80° C., on to an aluminum foil.

The foil thus coated is then passed under a Hanovia lamp at decreasing speeds until the film can no longer be removed with the finger. The reactivity is found to be 0.8 m/second. The surface of the film thus treated is very sticky.

EXAMPLE 7

A lamination adhesive which resists to pasteurization and sterilization is prepared from the following composition (in parts by weight):

| | |
|---|---|
| polyester of Example 1 | 45 |
| polyester acrylate* | 25 |
| mixed acrylate o-benzoylbenzoate ester of 1,6-hexanediol | 20 |
| mixed acrylate beta-dimethylamino-propionate ester of 1,6-hexanediol | 10 |

*this polyester acrylate is prepared by polycondensing 1 mole of a C₃₆— dimer fatty acid (Empol 1010 of UNILEVER-EMERY) with 2 moles 1,6-hexanediol, followed by esterification with 2.1 moles acrylic acid. The polyester acrylate thus obtained has a viscosity of 10 poises at 25° C and an acid number of 12.

The adhesive composition is spread on one side of an aluminum foil by means of a 4μ spiral scraper and this side, thus coated with the adhesive, is laminated against that side of a polyethylene foil that had previously been treated by corona effect. The adhesive is polymerized through the polyethylene foil by UV irradiation by means of an 80 W/cm Hanovia lamp at a distance of 7.5 cm and at a speed of passage of the laminate of 0.5 m/second. By means of an INSTRON apparatus, at the speed of 5 cm/minute, the force is determined which has to be exerted to separate again the two foils constituting the laminate:
(a) immediately after the manufacture of the laminate, this force is 600 g/cm;
(b) after 24 hours storage at room temperature, this force becomes 750 g/cm;
(c) strips are cut from this laminate and are dipped in a 1% aqueous solution of lactic acid and the solution containing the strips is then heated for 20 minutes at 120° C. in an autoclave under pressure. Immediately after cooling the laminate, the force necessary to separate the two foils of the laminate is 550 g/cm,
whereas 24 hours later, this force increases to 650 g/cm.

These results show that the lamination adhesive of this Example is perfectly suitable for the manufacture of laminates intended for packaging foodstuffs undergoing sterilization.

We claim:

1. A halogenated photopolymerizable adhesive, which comprises:
   (a) 20 to 70% by weight of at least one halogenated polymer, which:
      (1) has a chain interrupted by at least one oxygen or nitrogen atom,
      (2) contains from 4 to 70% by weight of halogen atoms attached to carbon atoms having the electronic configuration $sp^2$,
      (3) has an average molecular weight between about 700 and about 10,000 and
      (4) has a glass transition temperature (Tg) between about −80° C. and 20° C.;
   (b) 5 to 30% by weight of at least one organic monomer compound containing at least two acrylic and/or methacrylic acid radicals and containing from 0 to 65% by weight of halogen atoms attached to carbon atoms having the electronic configuration $sp^2$;
   (c) 20 to 70% by weight of at least one organic monomer compound containing an acrylic or methacrylic acid radical and containing from 0 to about 65% by weight of halogen atoms attached to carbon atoms having the electronic configuration $sp^2$;
   (d) about 1 to about 25% by weight of a photo-initiator system comprising:
      (1) 0.5 to 100% by weight of at least one aromatic ketone,
      (2) 0 to 99.5% by weight of at least one tertiary amine, at least one carbon atom of which, in the alpha position with regard to the nitrogen atom, carries at least one hydrogen atom,
      (3) 0 to 90% by weight of an aromatic or non-aromatic alpha-dione, the sum of (1) + (2) + (3) representing 100% by weight of the photoinitiator system;
   the total content of halogen atoms attached to carbon atoms having the electronic configuration $sp^2$ amounting to from about 3 to about 50% by weight of the total halogenated photopolymerizable adhesive.

2. The adhesive according to claim 1, wherein the halogenated polymer (a) is a halogenated polyester.

3. The adhesive according to claim 2, wherein the halogenated polyester does not contain any polymerizable unsaturation.

4. The adhesive according to claim 2, wherein the halogenated polyester contains polymerizable ethylenic unsaturation.

5. The adhesive according to claim 2, wherein the acid component with active halogen atoms of the halogenated polyester is selected from 1,4,5,6,7,7-hexachloro-bicyclo[2,2,1]-hept-5-ene-2,3-dicarboxylic acid, 1,4,5,6,7,7-hexachloro-bicyclo[2,2,1]-hept-5-ene-2-carboxylic acid, tetrachlorophthalic acid, tetrabromophthalic acid and 2,3,5,6,2',3',5',6'-octabromo-4,4'-di(3-carboxypropoxy)biphenyl.

6. The adhesive according to claim 2, wherein the acid component without active halogen atoms of the halogenated polyester is selected from phthalic acid, benzoic acid, adipic acid and trimellitic acid.

7. The adhesive according to claim 2, wherein the alcohol component without active halogen atoms of the halogenated polyester is selected from ethylene glycol, diethylene glycol, propylene glycol, 1,4-butanediol, 1,6-hexanediol, neopentyl glycol, hydrogenated bisphenol A, oxyethylated bisphenol A, tricyclodecane-dimethanol, trimethylolpropane and dipentaerythritol.

8. The adhesive according to claim 1, wherein the organic monomer compound (b) is a condensation product of (1) at least one polyalcohol containing 2 to 6 hydroxyl groups with (2) at least one alpha,beta-ethylenically unsaturated monocarboxylic acid containing 3 or 4 carbon atoms and with or without (3) at least one organic mono- to tetracarboxylic acid.

9. The adhesive according to claim 1, wherein the organic monomer compound (b) is 2,3,5,6,2',3',5',6'-octachloro-4,4-di-(2-(2-hydroxyethoxy)-ethoxy-biphenyl diacrylate.

10. The adhesive according to claim 1, wherein the organic monomer compound (b) is selected from diethylene glycol diacrylate, 1,6-hexanediol diacrylate, neopentyl glycol diacrylate, tetraethylene glycol diacrylate, trimethylolpropane triacrylate, oxypropylated glycerol triacrylate, pentaerythritol tetraacrylate, the condensation product of 1 mole $C_{36}$-dimer acid, 2 moles pentaerythritol and 6 moles acrylic acid and the condensation product of 1 mole $C_{36}$-dimer acid, 2 moles 1,6-hexanediol and 2 moles acrylic acid.

11. The adhesive according to claim 1, wherein the organic monomer compound (c) is a monoacrylate or a monomethacrylate of a mono- or polyhydric aliphatic, alicyclic or aromatic alcohol.

12. The adhesive according to claim 1, wherein the organic monomer compound (c) is 3-(pentachlorophenoxy)-propan-1-ol acrylate.

13. The adhesive according to claim 1, wherein the organic monomer compound (c) is selected from benzyl acrylate, 2-(2-phenoxyethoxy)-ethyl acrylate and the product obtained by esterifying, with acrylic acid, an ethyl acrylate-butyl acrylate-2-hydroxyethyl acrylate copolymer containing an average of one acrylic double bond per molecule.

14. The adhesive according to claim 1, wherein the aromatic ketone (1) of the photoinitiator system (d) is selected from benzophenone, Michler's ketone, 2-ethylanthraquinone, 2-chloro-thioxanthone and 1,6-hexanediol acrylate o-benzoylbenzoate; the tertiary amine (2) is selected from triethanolamine, diethylene glycol acrylate betadimethylamino-propionate and 1,6-hexanediol acrylate beta-dimethylamino-propionate, and the alpha-dione (3) is benzil.

15. The adhesive according to claim 1, wherein the halogenated polymer a) is the only component having halogen atoms fixed onto carbon atoms having the electronic configuration $sp^2$.

16. The adhesive according to claim 1, wherein both the halogenated polymer (a) and one of the organic monomer compounds (b) or (c) contain halogen atoms fixed onto carbon atoms having the electronic configuration $sp^2$.

17. The adhesive according to claim 1, wherein each of the components (a), (b) and (c) contains halogen atoms fixed onto carbon atoms having the electronic configuration $sp^2$.

18. Process for the preparation of the adhesive according to claim 1, which comprises homogenously mixing together the components (a), (b), (c) and (d), at room temperature or at a temperature higher than room temperature but sufficiently low to avoid a premature polymerization.

19. A lamination or contact adhesive composition, which comprises: the adhesive according to claim 1 alone or in admixture with non-copolymerizable inert polymers, inert plasticizers and transparent filling materials.

20. The adhesive according to claim 2, wherein the alcohol component with active halogen atoms of the halogenated polyester is selected from the group consisting of 2,3,5,6,2',3',5',6'-octachloro-4,4'-di-(2-(2-hydroxyethoxy)-ethoxy)-biphenyl and 2,3,5,6,2',2',6'-octabromo-4,4'-di-(2-(2-hydroxyethoxy)-ethoxy)-biphenyl.

21. The adhesive according to claim 1 wherein component (a) is the esterification product of 0.275 moles tetrachlorophthalic anhydride, 0.9 moles phthalic anhydride, 1.26 moles ethylene glycol and 0.025 moles benzoic acid,
component (b) is the polyester acrylate prepared by polycondensing 1 mole of a $C_{36}$-dimer fatty acid with 2 moles of 1,6-hexane diol, followed by esterification with 2 moles of acrylic acid and
components (c) and (d) are the mixed acrylate o-benzoylbenzoate ester of 1,6-hexanediol in admixture with the mixed acrylate beta-dimethylaminopropionate ester of 1,6-hexanediol.

* * * * *